United States Patent
Theuss et al.

(10) Patent No.: US 7,952,185 B2
(45) Date of Patent: May 31, 2011

(54) SEMICONDUCTOR DEVICE WITH HOLLOW STRUCTURE

(75) Inventors: Horst Theuss, Wenzenbach (DE); Gottfried Beer, Nittendorf (DE)

(73) Assignee: Infineon Technologies AG, Munich (DE)

( * ) Notice: Subject to any disclaimer, the term of this patent is extended or adjusted under 35 U.S.C. 154(b) by 67 days.

(21) Appl. No.: 11/645,150

(22) Filed: Dec. 22, 2006

(65) Prior Publication Data

US 2008/0136009 A1    Jun. 12, 2008

(30) Foreign Application Priority Data

Dec. 8, 2006 (DE) .......................... 10 2006 058 010

(51) Int. Cl.
*H01L 23/52* (2006.01)

(52) U.S. Cl. ........ 257/690; 267/678; 267/684; 267/709; 267/734; 267/738; 267/787; 267/788; 267/E21.502

(58) Field of Classification Search .................. 257/678, 257/698, 684, 690, 709, 734, 738, 787, 788, 257/E21.502; 438/106
See application file for complete search history.

(56) References Cited

U.S. PATENT DOCUMENTS

| | | | |
|---|---|---|---|
| 6,225,692 B1 * | 5/2001 | Hinds | ........................ 257/698 |
| 6,969,945 B2 | 11/2005 | Namba et al. | |
| 7,011,986 B2 * | 3/2006 | Daeche et al. | ................ 438/106 |
| 2003/0205797 A1 * | 11/2003 | Takahashi et al. | ............ 257/678 |
| 2004/0018667 A1 | 1/2004 | Joshi et al. | |
| 2005/0009315 A1 | 1/2005 | Kim et al. | |
| 2005/0189621 A1 * | 9/2005 | Cheung | ........................ 257/619 |
| 2005/0227401 A1 | 10/2005 | Lee et al. | |
| 2005/0236644 A1 | 10/2005 | Getten et al. | |

FOREIGN PATENT DOCUMENTS

| | | |
|---|---|---|
| DE | 103 10 615 B3 | 3/2003 |
| DE | 102 16 267 B4 | 4/2003 |
| EP | 0 794 616 A2 | 5/1997 |
| EP | 0 939 485 A1 | 2/1999 |
| EP | 1 065 716 A2 | 4/2000 |
| EP | 1 189 272 A1 | 3/2001 |
| JP | 2000329632 A | 11/2000 |
| WO | WO 2006/101270 A1 | 9/2006 |

OTHER PUBLICATIONS

Brunnbauer, M., et al., "An Embedded Device Technology Based on a Molded Reconfigured Water," IEEE, 2006, pp. 547-551.

* cited by examiner

*Primary Examiner* — David Vu
*Assistant Examiner* — Suberr Chi
(74) *Attorney, Agent, or Firm* — Brinks Hofer Gilson & Lione

(57) ABSTRACT

A device comprising a chip, which is held in casting compound and on which a hollow structure is arranged is disclosed.

13 Claims, 8 Drawing Sheets

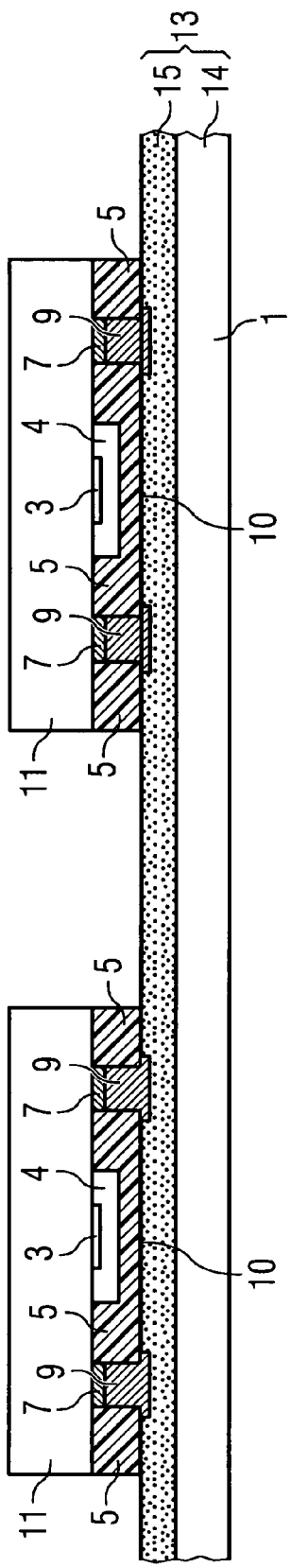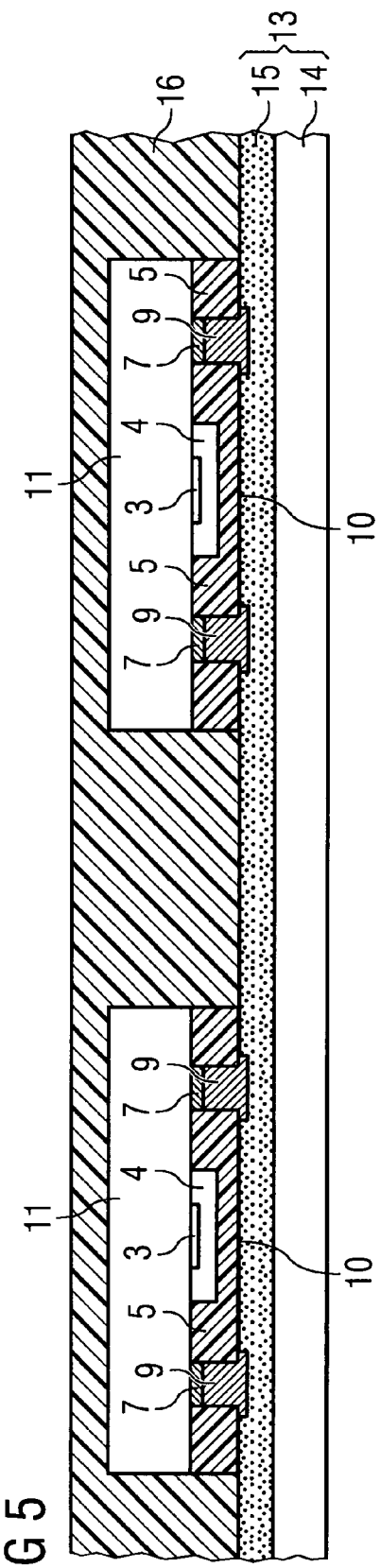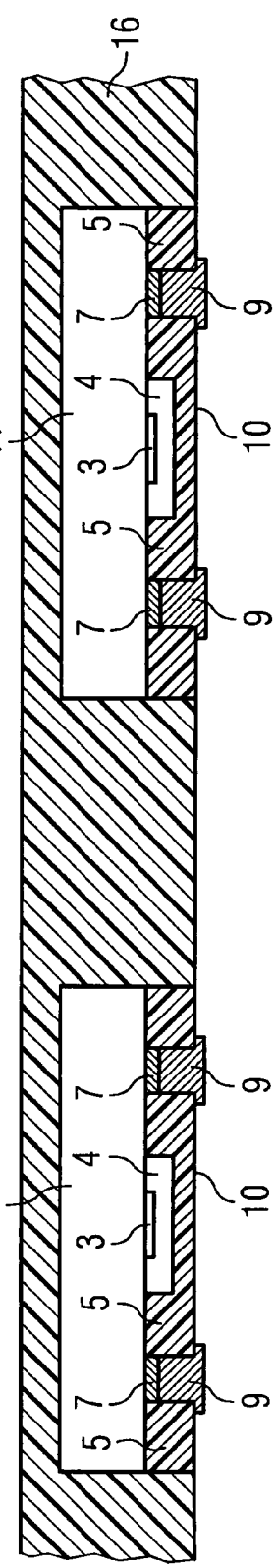

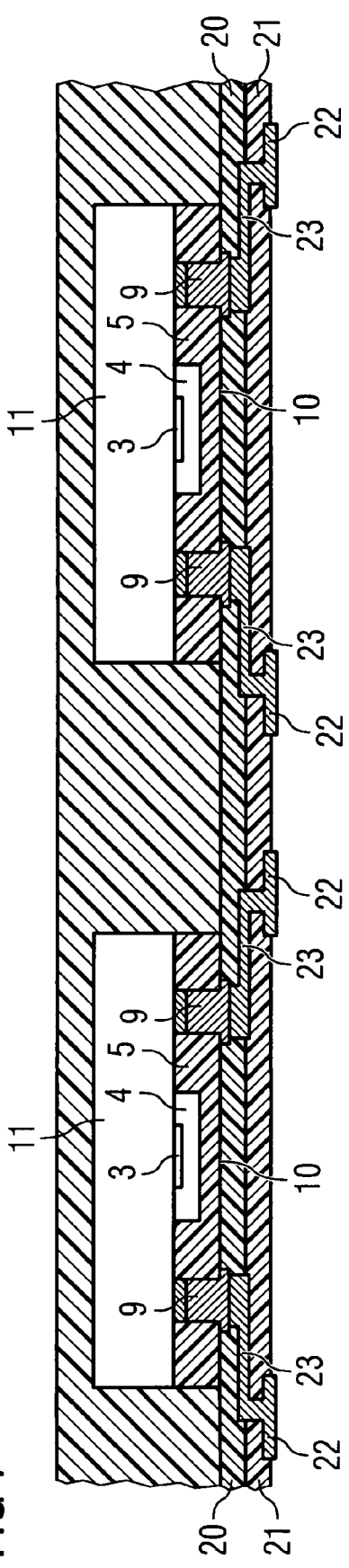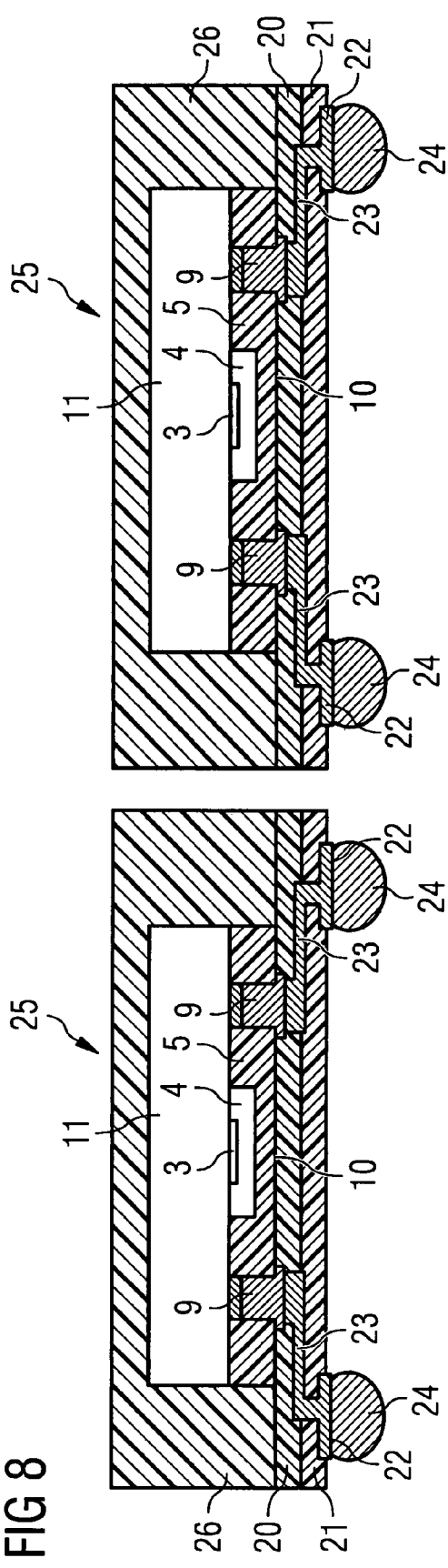

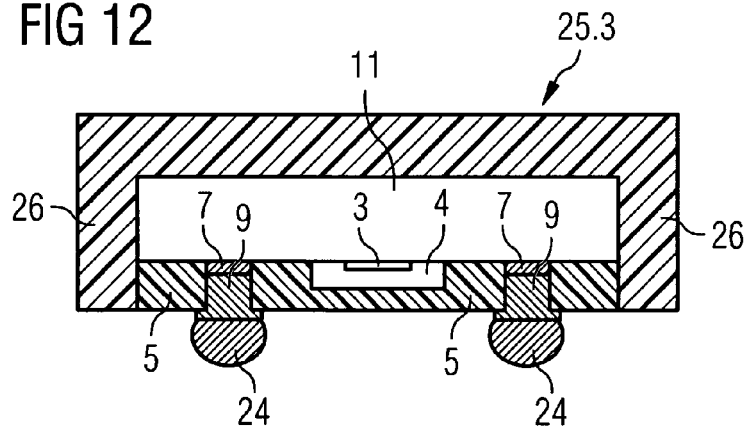
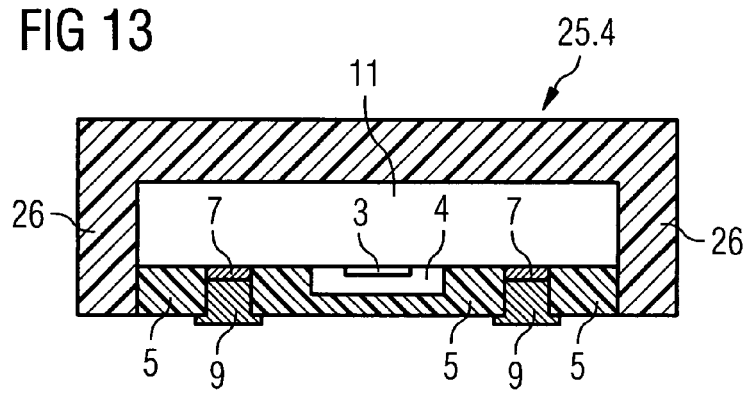
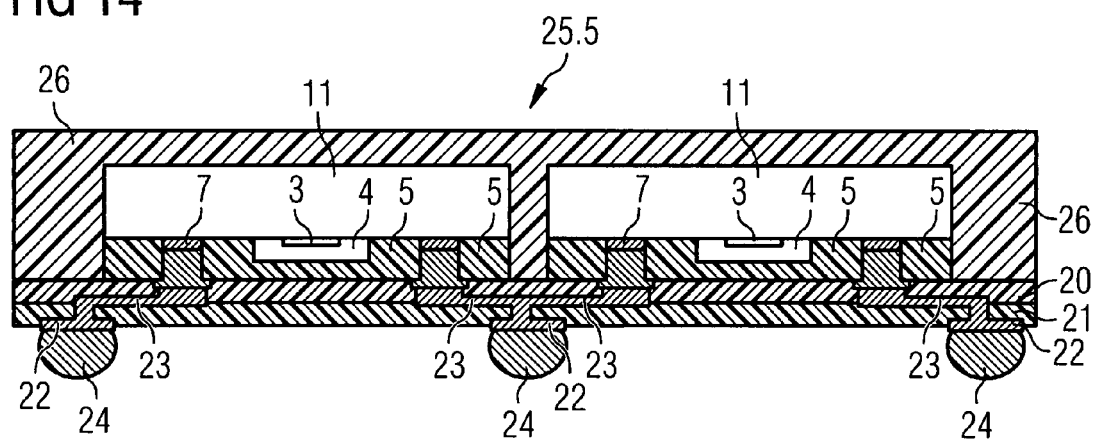

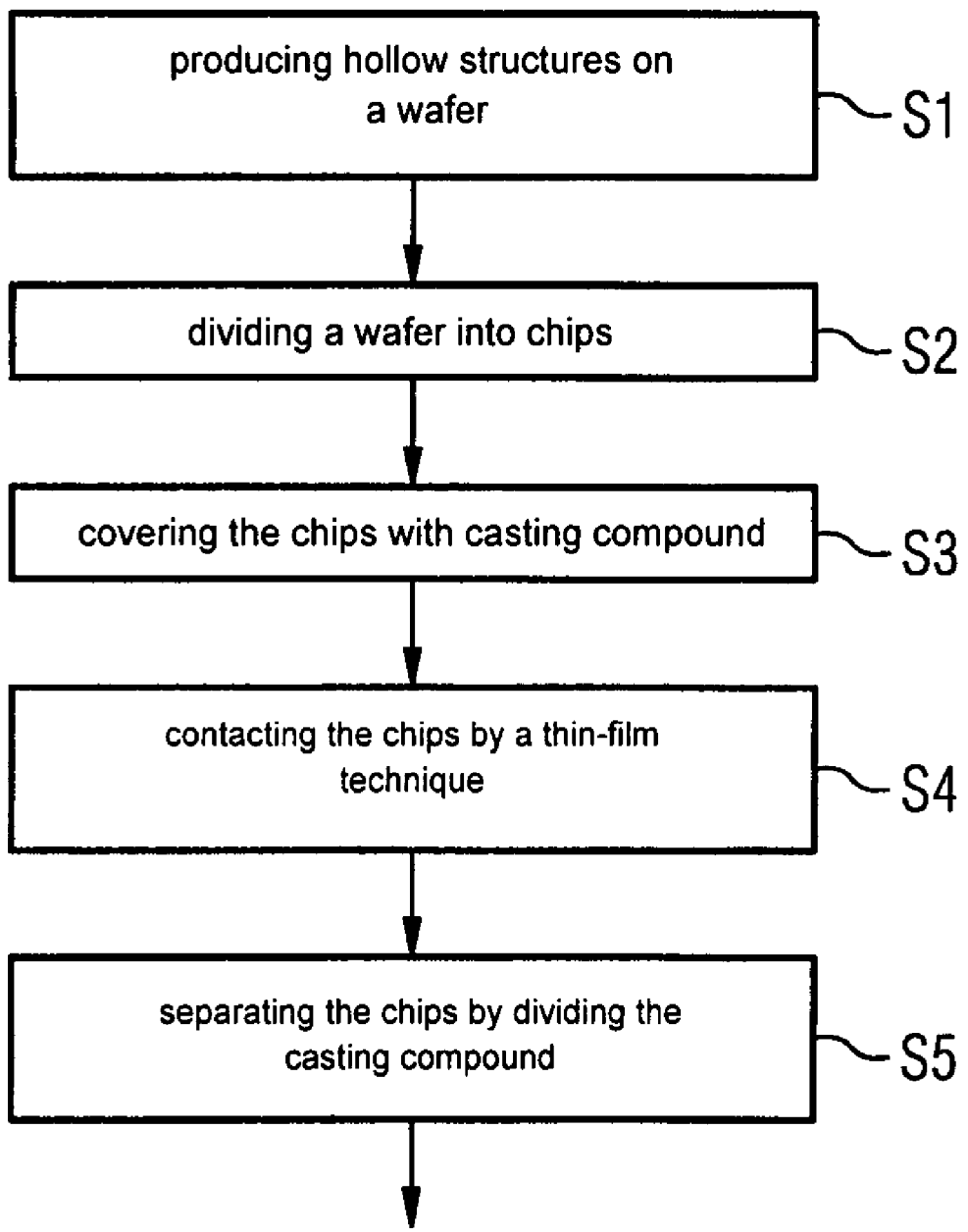

SEMICONDUCTOR DEVICE WITH HOLLOW STRUCTURE

RELATED APPLICATIONS

The present application claims priority to German Patent Application No 10 2006 058 010.9, filed Dec. 8, 2006, the entirety of which is hereby incorporated by reference.

FIELD OF THE INVENTION

The invention relates to semiconductor devices with hollow structures.

BACKGROUND

Many chips, in particular those with electromechanical systems, require a hollow to ensure their function. Various techniques are known for creating such a hollow. It is possible to create the walls of the hollow by structuring a layer, subsequently dividing up the wafer into individual chips and then closing the hollow by applying a cover to the walls of the hollow. Another possibility is to produce the hollow by using a further wafer which has depressions in its surface, forming hollows over the active surface of the first wafer when the two wafers are joined together.

SUMMARY

Against this background, according to a first aspect, a method of producing devices in which hollow structures are produced on a wafer is provided. The wafer is divided into at least two chips. The two chips are covered with casting compound. By dividing the casting compound, at least two chips are separated.

According to a second aspect, an arrangement which has a number of chips which are together held in casting compound and on which hollow structures are arranged is provided.

According to a third aspect, a device which has a chip which is held in casting compound and on which a hollow structure is arranged is provided.

BRIEF DESCRIPTION OF THE DRAWINGS

The invention is explained in more detail below by way of example with reference to the drawings, in which:

FIG. 4 shows a schematic sectional representation of two chips shown in FIG. 3, which have been placed on a carrier;

FIG. 5 shows a schematic sectional representation of the arrangement represented in FIG. 4 after casting with casting compound to produce a cast wafer;

FIG. 6 shows a schematic sectional representation of the subregion of the cast wafer that is shown in FIG. 5 after removal of the carrier;

FIG. 7 shows a schematic sectional representation of the subregion of the cast wafer that is shown in FIG. 6 after the creation of a wiring structure by the thin-film technique;

FIG. 8 shows a schematic sectional representation of the arrangement shown in FIG. 7 after the attachment of solder balls to external terminal areas of the wiring structure and after dividing the cast wafer into individual chip packages;

FIGS. 9-14 show schematic sectional representations of further exemplary embodiments of chip packages;

FIG. 16 shows a flow diagram to explain a method of producing a chip package.

DETAILED DESCRIPTION OF THE DRAWINGS

Devices with a chip embedded in a casting compound are described below. The chips may be of extremely different types and contain for example electrical or electromechanical functional elements in the region of their active area. The chips may be configured as so-called MEMS (Micro-Electro Mechanical Systems), it being possible for micro mechanical structures such as for example bridges, membranes or tongue structures to be provided. The chips may be configured as sensors or actuators, for example BAW (Bulk Acoustic Wave) filters, pressure sensors, acceleration sensors, rotation sensors, microphones and so on and so forth. Chips in which such functional elements are embedded generally comprise electronic circuits which serve for driving the functional elements or further process signals generated by the functional elements. Like the chip, the functional elements accommodated in the hollow may consist of semiconductor material, but may also be produced from other materials, such as for example insulators, plastics or metals.

As explained in more detail below on the basis of examples, multichip devices with a number of functional elements, for example the combination of two BAW filters with the same resonant frequency or tuned to slightly different resonant frequencies may be provided. Other chips and/or passive electronic components may also be integrated in a device along with the chip with a hollow structure provided on top. For example, a chip with a hollow structure for realizing the MEMS functionality (for example a BAW filter) and a chip without a hollow structure for signal generation and/or signal evaluation (for example an LNA (low noise amplifier)) may be provided in a multichip device. Apart from realizing the hollow structure from a polymer in the way described in more detail below, the hollow structure may also consist of other materials, for example a semiconductor material or an insulator, for example glass.

Figure 1:
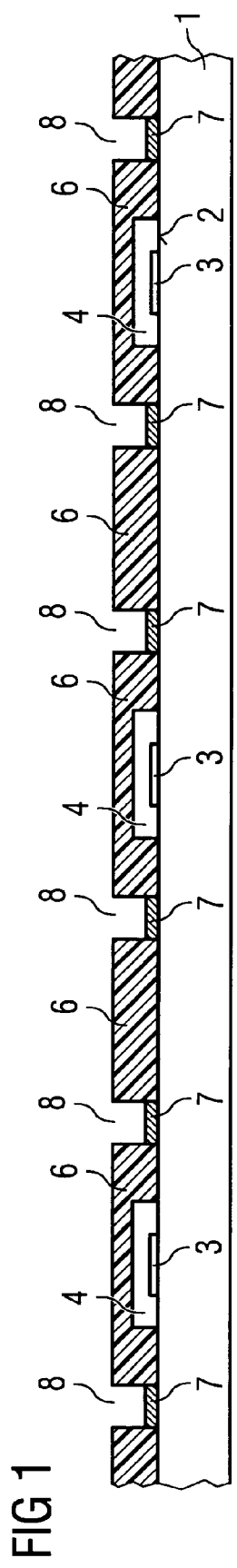
FIG. 1 shows a schematic sectional representation of a wafer with hollow structures arranged over the active area of the wafer.

FIG. 1 shows a semiconductor wafer 1, on the active surface 2 of which structures that are to be protected from environmental influences are formed, for example electromechanical functional elements 3. The functional elements 3 are respectively located in hollows 4, which are formed in a relatively thick (for example approximately 60 µm) layer 6, which has previously been applied to the active surface 2 of the already processed semiconductor wafer 1.

The hollows 4 are produced in the wafer assembly. This may be performed for example by a polymer material being used for the layer 6 and structured by a photopatterning technique. The creation of the hollows 4 in a polymer layer 6 is explained later by way of example on the basis of FIGS. 15A to 15E. In FIG. 16, production of the hollow is denoted by the step S1.

Furthermore, it is also possible to use photolithographic means to produce free regions 8, in which wafer metallizations 7 are created, in electrically conductive connection (not represented) with one or more electromechanical functional elements 3, and consequently forming terminal regions for the operation of the electromechanical functional elements 3.

Figure 2:
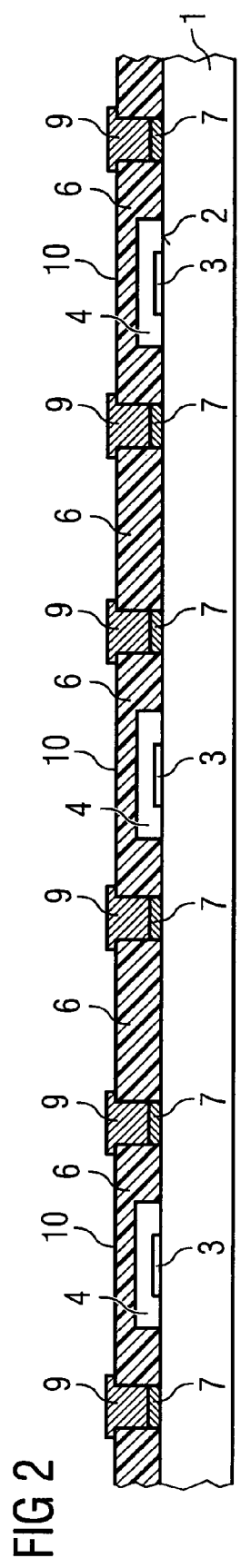
FIG. 2 shows a schematic sectional representation of the arrangement shown in FIG. 1 after the creation of contact elements.

FIG. 2 shows the filling of the free regions 8 above the wafer metallizations 7 with a contact element 9. The contact element 9 extends from the wafer metallization 7 to the upper side 10 of the layer 6 and can, as represented in FIG. 2, protrude somewhat beyond the upper side 10 of the layer 6 and reach around the upper edge of the layer 6. The contact element 9 may be created for example by a galvanic process ("electroplating") in a galvanic cell with a flow of electric current or by an electroless, selective deposition ("electroless metallization") of a suitable metal, for example nickel, from a bath on the wafer metallization 7. Both processes are likewise carried out in the wafer assembly. Alternatively, it is also possible to dispense with the creation of the contact elements 9 at the point in time represented in FIG. 2 and to create corresponding contact structures only at a later time, after creating a wiring structure (see for example FIG. 7).

Figure 3:
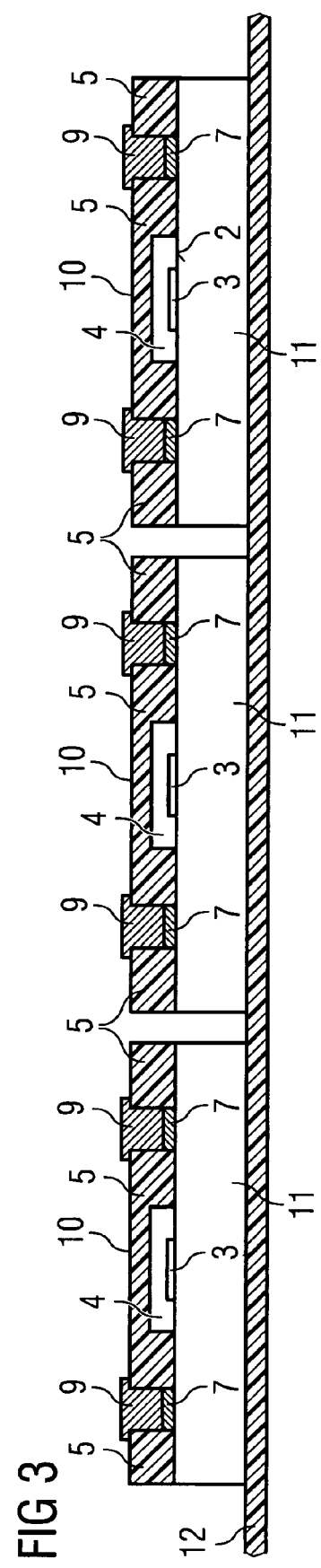
FIG. 3 shows a schematic sectional representation of the arrangement shown in FIG. 2 after the wafer has been divided into individual chips with hollow structures arranged on them.

According to FIG. 3, the wafer 1 with the structured layer 6 arranged on it is divided up into individual chips 11. This produces hollow enclosures 5. The singulation into chips 11 may be performed on a film 12, which has previously been applied to the rear side of the wafer 1. In FIG. 16, this method step is denoted by S2.

It is pointed out that the structuring of the outer walls of the hollow enclosure 5 does not necessarily have to be performed by the singulation into chips 11, but in the same way as the creation of the free regions 8 can be carried out photolithographically in the wafer assembly. This allows any desired peripheral form of the hollow enclosures 5 to be achieved, and in particular the hollow enclosures 5 may be dimensioned in such a way that they are arranged only over a partial region of the chip area. For example, a structuring of the layer 6 may be performed along the dividing lines provided for the chip singulation. This has the effect that the layer 6 is not subjected to mechanical stress during the chip singulation. In this case, a free space that runs around in the manner of a frame may be present between the outer edge of the chip 11 and the contour line of the hollow enclosure 5.

The production of the hollow enclosures 5 and wafer metallizations 7 by suitable structuring of a layer 6 represents a low-cost method, since essentially only layer depositing and photolithographic techniques have to be used, and the creation of the hollows 4 is performed in the wafer assembly. The hollow enclosures 5 may, however, also be created in some other way, for example by a second wafer (for example made of glass or semiconductor material) being provided with suitable depressions and joined together with the semiconductor wafer 1 in such a way that the depressions form the hollows 4. In this case, wafer metallizations 7 may be realized for example by etching free appropriate regions in the second wafer, used as a covering.

According to FIG. 4, the chips 11 are then placed on a carrier 13. The carrier 13 may be made up of a carrier material 14 (for example metal, silicon, glass or a polymer) and an adhesive layer 15 running over it. The chips 11 are applied with the upper side 10 of the hollow enclosure 5 to the adhesive layer 15 of the carrier 13, spaced apart from one another. Subsequently, the chips 11 with hollow enclosures 5 arranged on the carrier 13 are cast with a casting compound ("mould compound")(also referred to as "overmoulding"), see FIG. 5 and step S3 in FIG. 16. After the curing of the cast body formed in this way, which is referred to hereafter as cast wafer 16 (also referred to as "reconstituted wafer" or "artificial wafer"), the cast wafer 16 is detached from the carrier 13, see FIG. 6. This may be performed for example by supplying energy (for example heating), if an adhesive layer 15 that can be detached by supplying energy is used.

It is pointed out that the top region of the hollow enclosure 5 is not mechanically stressed by the casting step, since the upper side 10 of the hollow enclosure 5 is not encapsulated with casting compound. This makes it possible to prevent the hollow enclosure 5 being compressed by the casting step, which can very easily occur in the case of encapsulating the entire hollow enclosure 5, for example in the case of a hollow enclosure 5 consisting of polymer material. The free (i.e. unsupported) side wall regions of the hollow enclosure 5 are shorter than the free (i.e. unsupported) top region of the hollow enclosure 5 and may additionally be made stronger, so that no damage is caused by the casting operation in the side wall region surrounded by casting compound.

Before the cast wafer 16 is singulated into chip packages, further process steps may be carried out in the "cast wafer assembly". Such processes can be carried out at particularly low cost, since the chip packages can be simultaneously processed while they are still together in the cast wafer 16. The cast wafer 16 forms as it were an artificial wafer, to which the production steps known from WLP (wafer level packaging) technology can be applied. In WLP technology, all the processes carried out before a wafer is divided into chips are carried out at wafer level. By analogy with WLP technology, it may be provided in the present case that, after the production of the cast wafer 16, all the processes carried out before the cast wafer 16 is singulated into chip packages are carried out at "cast wafer level", i.e. for all the chip packages together on the intact cast wafer.

FIG. 7 shows how, by means of a thin-film technology applied to the cast wafer 16, the contact elements 9 of the chips 11 are wired into polymer layers 20, 21 lying over them. Firstly, the first polymer layer 20 is applied to the surface of the cast wafer 16, for example by "spin coating". Subsequently, the first polymer layer 20 is structured, for example photolithographically, so that contacting openings to the contact elements 9 are created. Subsequently, a first metallization layer is deposited and photolithographically structured to form conducting tracks (wiring lines 23). Subsequently, a second polymer layer 21 is deposited on the wiring lines 23 and likewise structured, so that openings to the wiring lines 23 are created. There follows a further metallizing and structuring step for external terminals, with which external terminal areas 22 are created. Through the openings of the second polymer layer 21, the external terminal areas 22 are electrically connected to the wiring lines 22, and consequently to the contact elements 9.

The thin-film technique that is used allows the polymer layers 20, 21 and metallization layers to be very thin and the structuring to be very fine. Typically, the polymer layers are 5 to 20 micrometers thick and the metallization layers 2 to 15 micrometers thick. The polymer layers 20, 21 consist for example of polyimide and are deposited by a depositing process, for example spin coating, on that surface of the cast wafer 16 that is formed in certain regions by the upper sides 10 of the hollow enclosures 5. The contacting of the chips 11 by means of a thin-film technique is illustrated in FIG. 16 as step S4.

If, other than as represented in FIG. 2, the contact elements 9 have not already been introduced into the free regions 8, the contacting of the wafer metallizations 7 with the wiring lines 23 may also be performed at a later time. For this purpose, the polymer layers 20, 21 may be opened at the correct locations photolithographically and subsequently filled by a contact element metallization.

Regions of the chip package outside the chip contour are also available for the wiring, i.e. the external terminal areas 22 may lie with some or all their surface area outside the contour line ("footprint") of the chip 11.

Subsequently, solder depots or solder balls 24 may be attached to the external terminal areas 22. This operation, referred to as ball attach, is likewise preferably performed on the intact cast wafer 16 and may be performed for example by means of templates which apply solder material to the external contact areas 22 at the correct locations.

After the performance of any further process steps there may be, the cast wafer 16 is divided up into individual chip packages 25, see FIG. 8 and step S5 in FIG. 16. The chip packages 25 may consist on the rear side and on their side wall regions 26 of casting compound. As already mentioned, the external terminal areas 22 may protrude beyond the chip contour or lie completely outside it, the increase in dimensions of the area available for the package contacting that can be achieved for the wiring being determined by the width of the side wall region 26. Wiring that is led out from the chip contour is also referred to as fan-out, as a result of which the chip package 25 may also be referred to as a "fan-out wafer level package".

Figure 9:
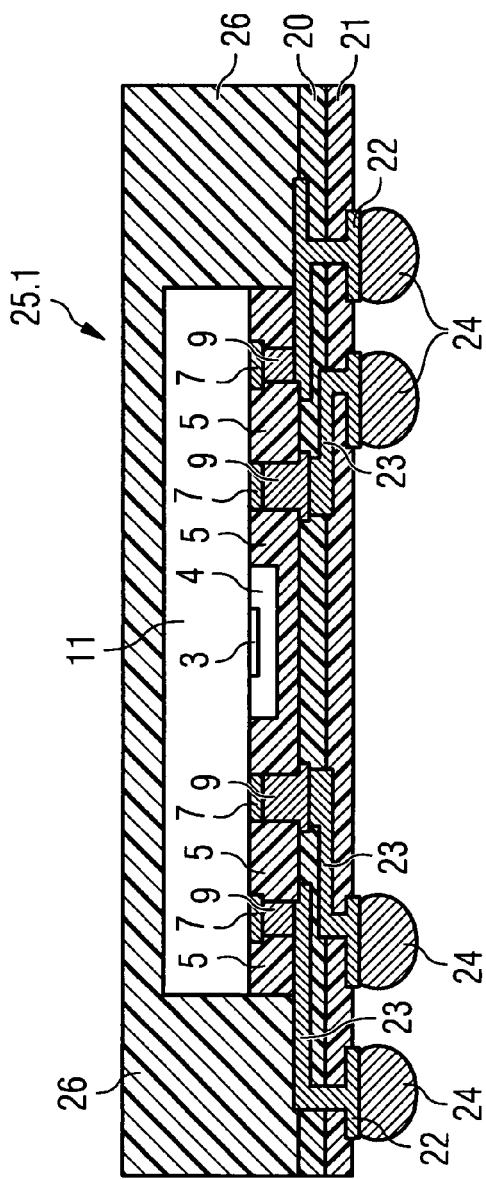

FIG. 9 shows a chip package 25.1, which differs from the chip package 25 shown in FIG. 8 essentially in that a greater number of external terminal areas 22 are provided, a first row of external terminal areas 22 being arranged underneath the chip 11 and a second row of external terminal areas 22 being arranged laterally outside the chip 11.

Figure 10:
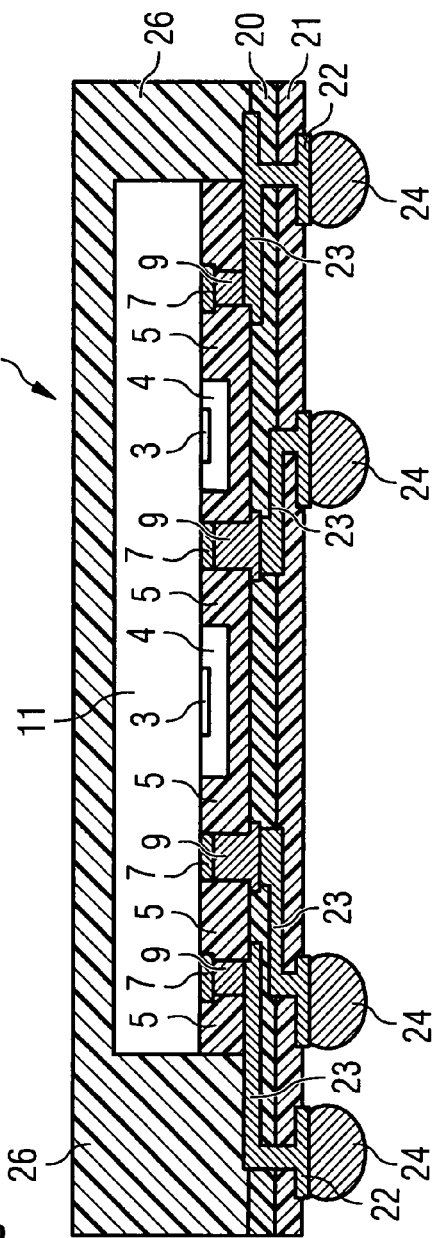

FIG. 10 shows a chip package 25.2, which differs from the chip package 25 shown in FIG. 8 essentially in that a number of hollow enclosures 5 or one hollow enclosure 5 with a number of hollows 4 are or is arranged on the chip 11.

Figure 11:
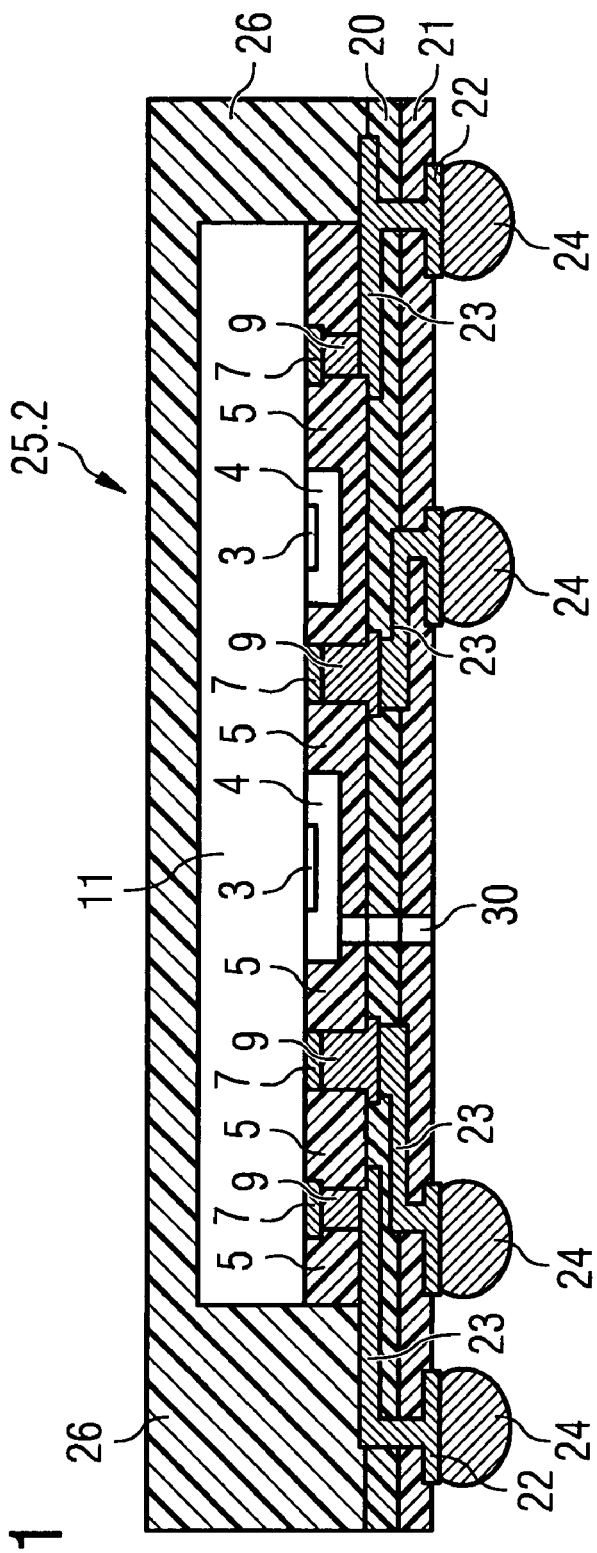

A further variant is to provide a passage 30, which passes through the polymer layers 20, 21 and the top region of the hollow enclosure 5 and consequently connects the hollow 4 to the surroundings. The passage 30 may be created for example by photopatterning. This variant of a chip package 25.2, represented in FIG. 11, is suitable for example for pressure sensors.

FIG. 12 shows a chip package 25.3 without a wiring structure. In the case of this embodiment, no increase in the terminal geometry can be achieved. The solder balls 24 are attached directly to the end faces of the contact elements 9, it being possible for the attachment to be performed in the way already described on the still intact cast wafer 16. A further configuration, represented in FIG. 13, also dispenses with the attachment of solder balls to the end faces of the contact elements 9. The chip package 25.4, represented in FIG. 13, may be fastened by means of a reflow process directly to a printed circuit board or PCB, to which solder material has previously been applied at the correct locations, for example by suitable solder paste printing.

SiP (system in package) modules, which may contain a number of chips 11 or a single chip 11 and further passive or discrete devices in a chip package 25.5, can also be realized as a further configuration. FIG. 14 shows an example of such a SiP module. The two chips 11 are electrically coupled to each other by means of a common wiring structure, which may possibly also have common external terminal areas 22. It is also possible for the chips 11 to have no electrically coupled wiring structure and to interact with each other for example by means of other mechanisms (mechanically, magnetically etc). Furthermore, it may also be provided that only one of the chips 11 has a hollow enclosure 5, while one or more other chips (not represented) are configured in a conventional way without a hollow enclosure 5 and are enclosed by the casting compound.

FIGS. 15A to 15E illustrate by way of example a method of producing the hollow enclosures 5. Although FIGS. 15A to 15E only show the production of a hollow enclosure 5 on a chip 11, the technique explained below is used in the wafer assembly, i.e. for the simultaneous production of all the hollow enclosures 5 on the wafer 1.

As described in conjunction with FIG. 1, firstly a thick polymer layer 6, for example SU8, is deposited over the wafer 1. By means of a first photomask 40, those regions of the polymer layer 6 that are later intended to form the wall regions of the hollow enclosure 5 are exposed with light of a certain wavelength, see FIG. 15A. By means of a second photomask 41, a region of the polymer layer 6 that is intended to form the top region of the hollow enclosure 5 is exposed by means of light (possibly of a different wavelength). A hole portion 42 is thereby masked, see FIG. 15B.

Figure 15A:
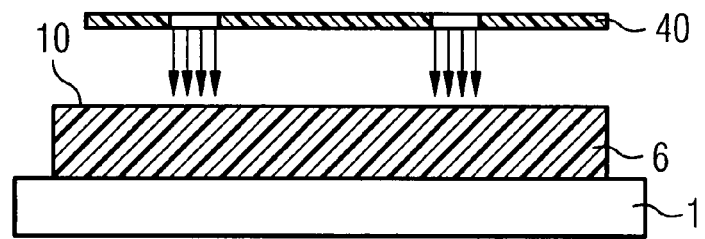
FIGS. 15A-15B show schematic sectional representations to explain a method of producing hollow structures.
Figure 15B:
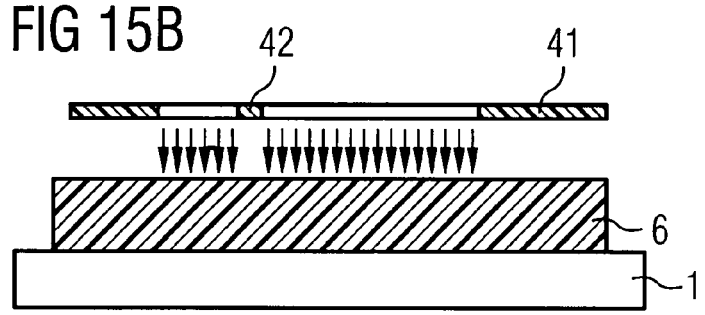
Figure 15C:
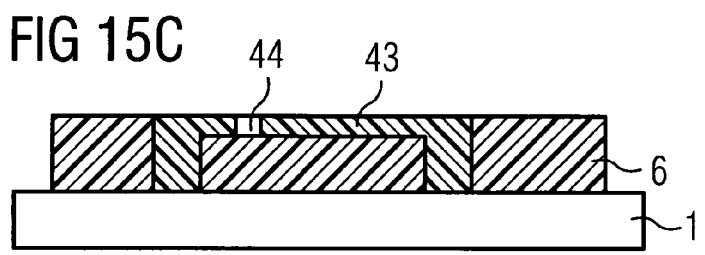

The exposures have the effect of inducing in the polymer layer 6 a crosslinkage of the exposed regions with different depths that can be specifically set. The different depths may be accomplished for example by using different wavelengths of the light used for the exposure. The crosslinked regions 43 are represented in FIG. 15C.

Figure 15D:
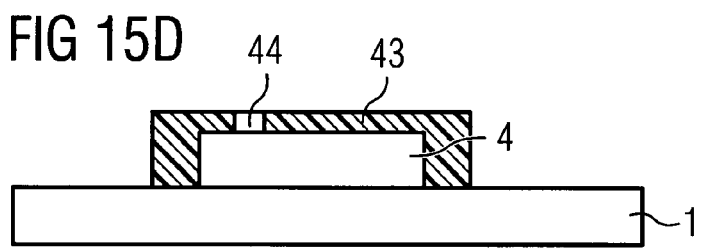

In FIG. 15D, an ultrasound-assisted spray developing method is used to develop or etch free the hollow 4. The polymer layer 6 is thereby removed as far as the crosslinked regions 43. Within the crosslinked regions 43, the material removal is performed through the top hole 44, see FIG. 15D.

Figure 15E:
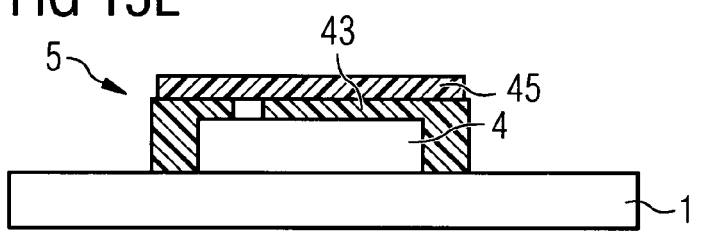

The top hole 44 may possibly be closed with a further polymer layer 45. The structure 5 represented in FIG. 15E represents an example of the hollow enclosure 5 described in the previous exemplary embodiments (in this case also with photopatterned outer walls).

It is true for all the exemplary embodiments that a high degree of flexibility is made possible with respect to arrangements and geometries of hollow enclosures 5 and external terminal areas 22. The production of the hollow enclosures 5 at wafer level makes production possible in a low-cost way. A further cost reduction is achieved by the use of low-cost "photoresist hollow enclosures" of a polymer, allowing a packaging with reliable process attributes to be achieved in spite of their low mechanical load-bearing capacity as a result of the top region 10 being left free during the casting. The multilayer thin-film technique allows a "fan-out design" to be achieved on the contact level, by which package terminals can be realized outside the chip area, thereby making it possible to achieve both an increase in the contacting reliability, by increasing the pitch spacing between external terminal areas, and an increase in the number of external terminal areas. This also opens up new possibilities in particular for the production of SiP modules of extremely varied types and designs.

It is therefore intended that the foregoing detailed description be regarded as illustrative rather than limiting, and that it be understood that it is the following claims, including all equivalents, that are intended to define the spirit and scope of this invention.

The invention claimed is:
1. A device, comprising:
a chip, which is held in a casting compound and on which a hollow structure is arranged, the casting compound and the hollow structure each forming part of a surface of the device which extends substantially in parallel to a principal plane of the chip;
a dielectric layer, a first electrically conductive layer overlying at least a part of a surface formed by the casting compound and a part of a surface being formed by the hollow structure, wherein the first electrically conductive layer is arranged between the chip and the dielectric layer, and wherein the hollow structure is arranged between the chip and a portion of the first electrically conductive layer in relation to a direction normal to the principal plane.

2. The device of claim 1 wherein the hollow structure is arranged over an active area of the chip.

3. The device of claim 1, wherein an upper side of the hollow structure is not covered by casting compound.

4. The device of claim 3, wherein a chip surface opposite from an active surface of the chip, all the side areas of the chip, and side areas of the hollow structure are surrounded by casting compound.

5. The device of claim 1, further comprising a wiring structure comprising the first electrically conductive layer, at least one dielectric layer, and a second electrically conductive layer.

6. The device of claim 5, wherein the wiring structure extends in a direction parallel to the principal plane outwards beyond the contour of the chip.

7. The device according to claim 5, wherein the hollow structure is arranged between an active area of the chip and the wiring structure in a direction normal to the principal plane.

8. The device of claim 1, wherein a plurality of hollow structures are arranged over an active area of the chip.

9. The device of claim 1, wherein the hollow structure is a hollow structure comprising a polymer material.

10. The device of claim 9, wherein the hollow structure comprises an upper side facing away from the chip,
wherein the upper side is not covered by casting compound and forms part of the surface of the device; and
wherein the first electrically conductive layer extends over at least a part of the upper side of the hollow structure.

11. The device of claim 9, wherein the polymer material is a photoresist.

12. The device of claim 1, wherein the hollow structure further comprises a first surface facing towards the chip and a second surface opposite to the first surface facing away from the chip, wherein the second surface forms part of the surface of the device.

13. A device, comprising:
a chip, which is held in a casting compound and on which a hollow structure is arranged, the hollow structure having a lid and a sidewall, the sidewall enclosing a portion of the chip, extending between a surface of the chip and the lid, and the lid at least partially covering the portion of the chip; and
a first electrically conductive layer, which has been applied at least in certain regions to the casting compound;
wherein the lid of the hollow structure comprises a through-hole for connecting the hollow structure to its surroundings, the through-hole being hollow, and
wherein the first electrically conductive layer and the through-hole are arranged at a same side of the chip.

* * * * *